(12) United States Patent
Whatmough

(10) Patent No.: US 10,878,315 B1
(45) Date of Patent: Dec. 29, 2020

(54) DATA CONVERTERS AND METHODS FOR MEMORY ARRAYS

(71) Applicant: Arm Limited, Cambridge (GB)

(72) Inventor: Paul Nicholas Whatmough, Cambridge, MA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/457,805

(22) Filed: Jun. 28, 2019

(51) Int. Cl.
| | |
|---|---|
| *G06N 3/063* | (2006.01) |
| *H03M 1/34* | (2006.01) |
| *G11C 11/16* | (2006.01) |
| *G06N 3/08* | (2006.01) |
| *G06N 3/06* | (2006.01) |
| *G11C 7/16* | (2006.01) |

(52) U.S. Cl.
CPC ............ *G06N 3/063* (2013.01); *G06N 3/06* (2013.01); *G06N 3/082* (2013.01); *G11C 11/1655* (2013.01); *G11C 11/1657* (2013.01); *H03M 1/34* (2013.01); *G11C 7/16* (2013.01)

(58) Field of Classification Search
None
See application file for complete search history.

(56) References Cited

U.S. PATENT DOCUMENTS

| | | | | |
|---|---|---|---|---|
| 9,430,735 | B1 * | 8/2016 | Vali | G11C 7/1006 |
| 10,418,098 | B2 * | 9/2019 | Srinivasan | H03M 1/12 |
| 2019/0088309 | A1 * | 3/2019 | Li | G11C 7/1006 |
| 2019/0179776 | A1 | 6/2019 | Fick et al. | |
| 2020/0012924 | A1 * | 1/2020 | Ma | G06N 3/063 |

OTHER PUBLICATIONS

Successive approximation ADC; Wikipedia; Mar. 2019. https://en.wikipedia.org/wiki/Successive_approximation_ADC.

Fick, et al; Analog Computation in Flash Memory for Datacenter-scale AI Inference in a Small Chip; Mythic; 2018. https://www.hotchips.org/hc30/2conf/2.05_Mythic_Mythic_Hot_Chips_2018_V5.pdf.

Parashar, et al.; SCNN: An accelerator for compressed-sparse convolutional neural networks; 2017 ACM/IEEE 44th Annual International Symposium on Computer Architecture (ISCA); IEEE; Dec. 2017. DOI: 10.1145/3079856.3080254.

Shafiee, et al.; ISAAC: A Convolutional Neural Network Accelerator with In-Situ Analog Arithmetic in Crossbars; 2016 ACM/IEEE 43rd Annual International Symposium on Computer Architecture (ISCA); IEEE; Aug. 2016. DOI: 10.1109/ISCA.2016.12.

Reagen, et al.; Minerva: Enabling Low-Power, Highly-Accurate Deep Neural Network Accelerators; 2016 ACM/IEEE 43rd Annual International Symposium on Computer Architecture (ISCA); IEEE; Aug. 2016. DOI: 10.1109/ISCA.2016.32.

(Continued)

*Primary Examiner* — Howard Williams
(74) *Attorney, Agent, or Firm* — Pramudji Law Group PLLC; Ari Pramudji

(57) ABSTRACT

In a particular implementation, a method of data conversion is disclosed. For example, for each word-line of a plurality of word-lines in a memory array, the method includes: 1) determining, by a digital comparator, if digital data exceeds a particular threshold, and 2) in response to the digital data determined to be above the threshold, transmitting, by the digital comparator, an output signal corresponding to the digital data to a digital-to-analog converter (DAC) device. Additionally, the DAC is configured to generate an analog signal.

17 Claims, 7 Drawing Sheets

(56) References Cited

OTHER PUBLICATIONS

Likamwa, et al.; RedEye: Analog ConvNet Image Sensor Architecture for Continuous Mobile Vision; 2016 ACM/IEEE 43rd Annual International Symposium on Computer Architecture (ISCA); IEEE; Aug. 2016. DOI: 10.1109/ISCA.2016.31.
Chi, et al.; PRIME: A Novel Processing-in-Memory Architecture for Neural Network Computation in ReRAM-Based Main Memory; 2016 ACM/IEEE 43rd Annual International Symposium on Computer Architecture (ISCA); IEEE; Aug. 2016. DOI: 10.1109/ISCA.2016.13.
PCT International Search Report and Written Opinion; PCT/GB2020/050627, dated Jun. 19, 2020.
Chen, et al.; EMAT: An Efficient Multi-Task Architechture for Transfer Learning using ReRAM; 2018 IEEE/ACM ICCAD; Nov. 2018 DOI: 10.1145/3240765.3240805.
Sun, et al.; Energy-Efficient SQL Query Exploiting RRAM-based Process-in-Memory Structure; 2017 IEEE 6th NVMSA; Aug. 2017 DOI: 10.1109/NVMSA.2017.8064463.
Song, et al.; PipeLayer: A Pipelined ReRAM-Based Acceleratory for Deep Learning; 2017 IEEE HPCA; Feb. 2017. DOI: 10.1109/HPCA.2017.55.
Wood; Principles of Gating; Current Protocols in Cytometry; Supplement 3; 1998.

\* cited by examiner

US 10,878,315 B1

DATA CONVERTERS AND METHODS FOR MEMORY ARRAYS

I. FIELD

The present disclosure is generally related to data converters and methods for data conversion in memory arrays.

II. DESCRIPTION OF RELATED ART

Neural networks are machine learning models that employ one or more layers of models to generate an output, e.g., a classification, for a received input. Currently, neural networks (NNs) have become increasingly popular in solving a range of classification and regression problems associated with image classification, audio/speech recognition and translation, etc. Nevertheless, neural networks can demand large compute and memory resources and therefore is challenging for power-constrained, battery powered devices.

One approach to reduce the compute cost of NN inference, is to use a mixed-signal approach based on a cross-bar memory array. For such arrays, to allow for storage of the intermediate data, digital-to-analog (DAC) and analogue-to-digital (ADC) converters may be implemented at the input and output of the array, respectively. However, the area and power cost of such ADCs and DACs can be significant and can negatively offset the benefits of the analog-domain multiplication and addition operations of such arrays. Accordingly, there is a need in the art to reduce the circuit area and energy cost associated with conventional DACs and ADCs.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
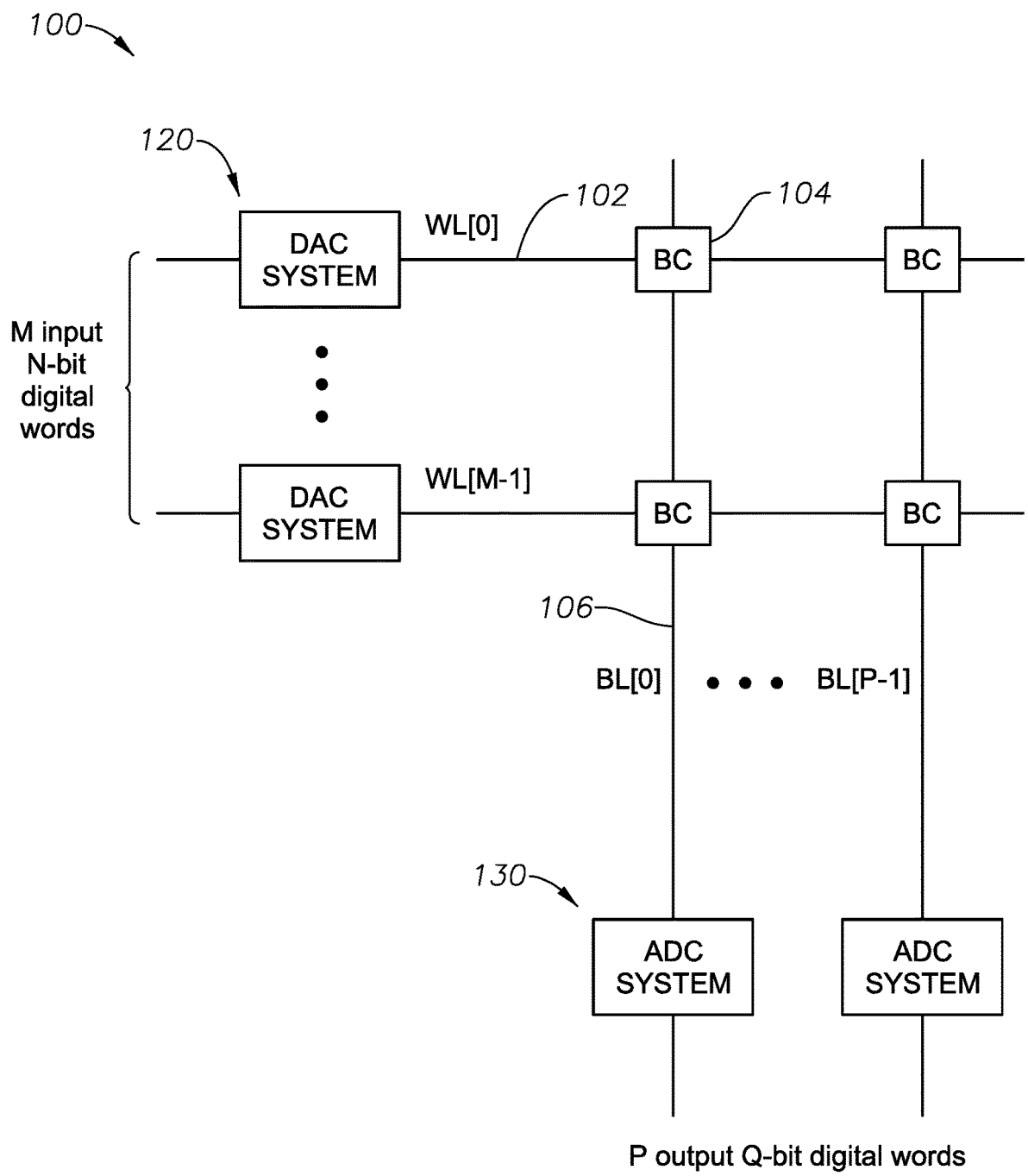
FIG. 1 is a schematic diagram of a memory array implementable with example methods for converting data.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a method of data conversion is disclosed. For example, for each word-line of a plurality of word-lines in a memory array, the method includes: 1) determining, by a digital comparator, if digital data exceeds a particular threshold, and 2) in response to the digital data determined to be above the threshold, transmitting, by the digital comparator, an output signal corresponding to the digital data to a digital-to-analog converter (DAC) device. Additionally, the DAC is configured to generate an analog signal.

According to another implementation of the present disclosure, a method of data conversion is disclosed. For example, for each of the bit-lines in a memory array, the method includes: 1) determining, by an analog comparator, if an analog voltage exceeds a particular threshold, and 2) in response to the incoming data exceeding the threshold, transmitting, by the analog comparator, an output signal corresponding to the analog voltage to an analog-to-digital converter (ADC) device. Additionally, the ADC is configured to generate digital data.

According to another implementation of the present disclosure, a memory array is disclosed. The memory array includes a plurality of word-lines coupled to a plurality of bit-cells, where each of the word-lines is configured to transmit data to the plurality of bit-cells. The memory array further includes a plurality of bit-lines coupled to the plurality of bit-cells, where each of the bit-lines is configured to transmit data from the plurality of bit-cells. Moreover, the memory array includes a plurality of digital-to-analog (DAC) systems configured to transmit data on the plurality of word-lines, and a plurality of analog-to-digital (ADC) systems configured to receive data on the plurality of bit-lines.

Particular implementations of the present disclosure are described below with reference to the drawings. In the description, common features are designated by common reference numbers throughout the drawings.

Advantageously, inventive aspects of the present disclosure utilize characteristics (i.e., properties) of signal statistics to reduce circuit cost (e.g., with respect to area, latency, and power). For instance, in the context of neural networks, incoming intermediate "activation" data may be presumed to arrive in a fairly sparse manner. Accordingly, taking advantage of the type and manner of the incoming code, the inventive aspects involve circuit operations that can be implemented to best optimize the data.

In such instances, the activation data may be generated as a result of matrix multiplications or dot product operations. If the data is positive, it would likely follow the positive half of a Gaussian distribution having an average near non-zero value. Accordingly, the majority of data values would either be zero or "small" positive non-zero. Moreover, as such data values can be clamped for a range of small non-zero values to zero, the sparsity of useful data value would be increased, thus allowing for compression and other optimizations without increasing the performance of the neural networks. Hence, due to these sense stationary observations of the activation data, data conversion of the activation data can be significantly improved for neural network inference applications.

Referring to FIG. 1, an optimized cross-bar memory array 100 is shown. As depicted, the example memory array 100 comprises a plurality word-lines (WL) 102 (i.e., a plurality of word-line channels) (e.g., WL[0] to WL[M−1]), a plurality of bit-cells (BC) 104 (i.e., storage elements, BC elements), a plurality of bit-lines (BL) 106 (i.e., a plurality of bit-line channels) (e.g., BL[0] to BL[P−1]), a plurality of DAC systems 120 (i.e., optimized DAC circuits), and a plurality of ADC systems 130 (i.e., optimized ADC circuits). As shown in FIG. 1, and as discussed in below paragraphs, the plurality of DAC systems 120 and the plurality of ADC systems 130 are coupled to the plurality of word-lines 102 and the plurality of bit-lines 106, respectively, while the plurality of bit-cells 104 are coupled to the plurality of word-lines 102 and the plurality of bit-lines 106 in a cross-bar circuit configuration (e.g., mixed-signal array configuration). In certain implementations, such cross-bar circuit configurations can be utilized for various matrix multiplication and dot-product operations. Moreover, in some implementations, such configurations may also be performed for neural network computations in a neural network having a plurality of neural network layers.

In an example mixed-signal array, multiplications may be performed using the resistance of each of the bit-cells 104. The resistance of each bit-cell may be set according to the weights of the neural network during a programming phase. In certain instances, all the BC elements in a column can contribute a current to a bit line (e.g., summed-up following Kirchhoff's current law), and hence, implicitly performing the addition operation required in the neural networks.

In a particular operation, with reference to FIG. 1, the plurality of word-lines 102 are configured to transmit (i.e., transfer) data to the plurality of bit-cells 104 and the plurality of bit-lines 106 are configured to transmit (i.e., transfer) data from the plurality of bit-cells 104. Moreover, the plurality of DAC systems 120 may be configured to transmit data on the plurality of word-lines 102, and the plurality of ADC systems 130 may be configured to the receive data on the plurality of bit-lines 106. In certain implementations, as described with reference to FIG. 1 and to circuit operations in below paragraphs, M input N-bit digital words (i.e., digital code) are input from the plurality of DAC systems 120 on the plurality of M word-line channels 102, and P output Q-bit digital words are output from the plurality of ADC systems 130 on the P bit-line channels 106.

Figure 2:
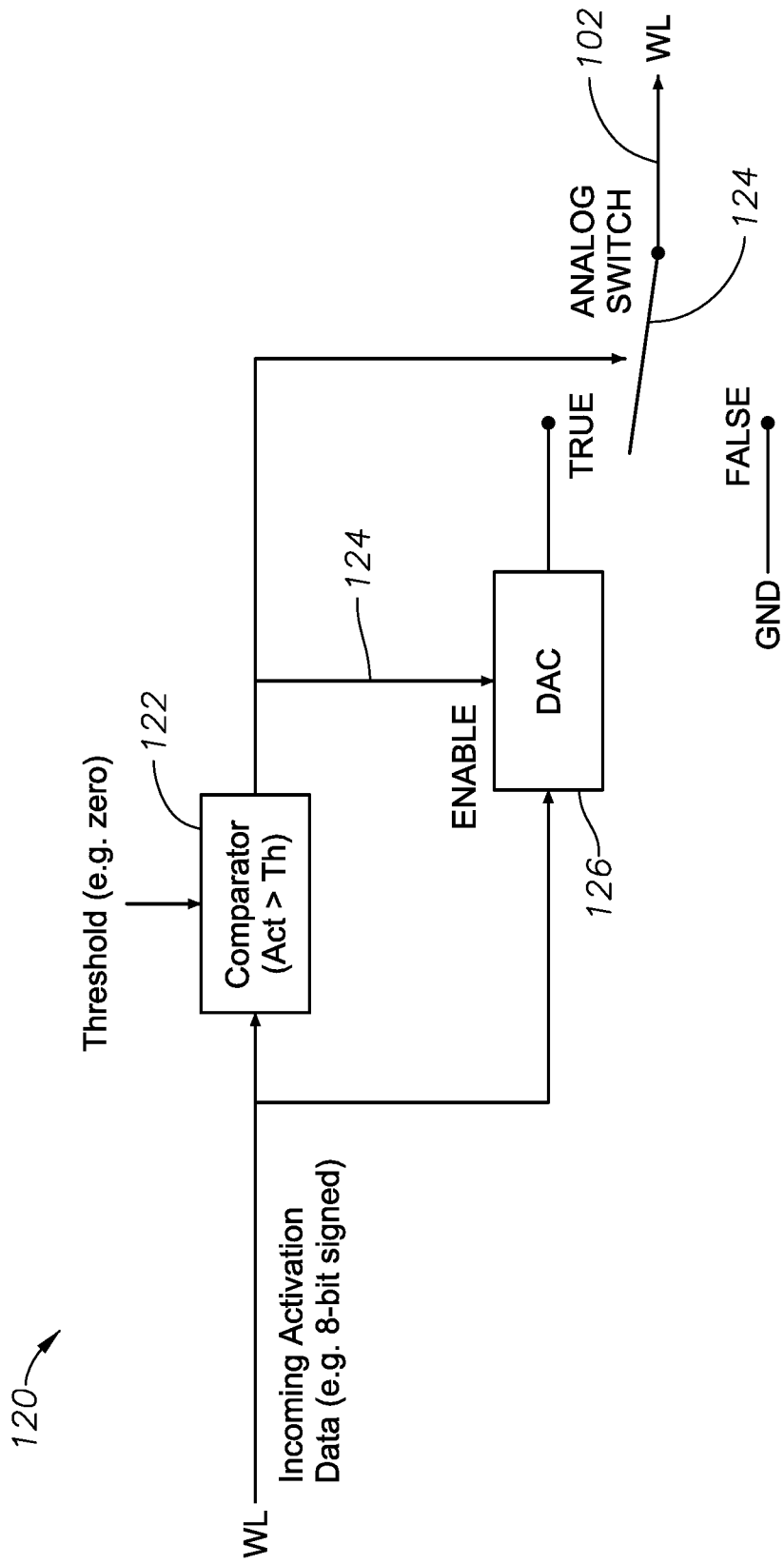
FIG. 2 is a schematic diagram of a portion of the memory array in FIG. 1 implementable with example methods for data conversion.

Referring to FIG. 2, an example optimized DAC system (of the plurality of DAC systems) 120 is shown. As depicted, the example DAC system 120 comprises a digital comparator 122, an analog switch 124, and a digital-to-analog (DAC) device 126.

Advantageously, in certain instances, the example optimized DAC system 120 may be implemented for sparse neural network activations.

The digital comparator 122 may be one or more circuit device(s) (e.g., logic devices) that may "AND" each data-bit of an incoming 8-bit data word to detect (e.g., to check) whether such data-bit (e.g., on each wire) of the 8-bit data word is below a particular threshold (i.e., a comparison with "0") such that the 8-bit data words correspond to "0". If so, the output of the digital comparator 122 would represent a digital "0" value. In certain examples, the digital comparator 122 may be one or more logic devices including AND-gates coupled in: series, a multiplexer, or any other circuit implementation that allows for 8 data-bit input values and 1 data-bit output value. In other implementations, instead of a comparison with "0", the digital comparator may compare the 8-bit data word with a different particular threshold value (e.g., a near-non-zero value, an arbitrary but pre-determined value, where the threshold value can define a set of "small" (positive low value) non-zero values. In some instances, such small non-zero values may also be ignored by the example DAC system 120 and the memory array 100.

The analog switch 124 may be implemented with any type of transistor-based switch (i.e., pull-down device) (e.g., NMOS devices (n-channel MOSFETs (metal-oxide-semiconductor field-effect transistors) devices) or PMOS devices (PMOS devices (p-channel MOSFETs (metal-oxide-semiconductor field-effect transistors) devices), etc.

The DAC device 126 may be any circuitry using various known electronic elements (e.g., including pulse width modulators, oversampling and interpolating DACs, binary-weighted DACs/resistors, switched-resistor, switched-capacitor, switched-current source, summing amplifiers, resistor ladder circuits, cyclic DAC, etc.) to convert a digital input signal (i.e., a binary digital output signal from the digital comparator 122) to an analog current signal or analog voltage signal. In some implementations, the DAC device 126 is configured to receive an enable signal 124 when the digital comparator 122 may determine that enable conditions are satisfied for clock gating. In such implementations, through various clock gating techniques, portions of the circuitry may be disabled such that certain implemented latches would not switch states, and thus, power consumption can be reduced.

In certain implementations of the optimized cross-bar memory array 100 in FIG. 1, one or more binary digital output signals (e.g., up to eight binary digital output signals) transmitted on respective one or more WLs 102 (e.g., multiple WLs 102 of the respective DAC systems 122) can be coupled (i.e., connected) to each DAC device 126 (a common DAC device) via an analog multiplexer (not shown). In such implementations, for example, if for the memory array 100 the number of non-zero digital data is greater than the number of DAC devices, then at least two cycles will be needed to drive all of the WLs 102. Accordingly, in such implementations, the optimized cross-bar memory array 100 can realize additional savings by minimizing the quantity of required DAC devices 126, as well as an additional reduction in power consumption. In an example where the optimized cross-bar memory array 100 is a neural network, such implementations can be optimal to save overall circuit area, as a significant portion of incoming data words would be equal to "0" or near "0", and so, such data words would not be transmitted to the bit-cells 104. Hence, such implementations would not require an individual respective DAC device 126 for each particular WL 102.

Figure 3:
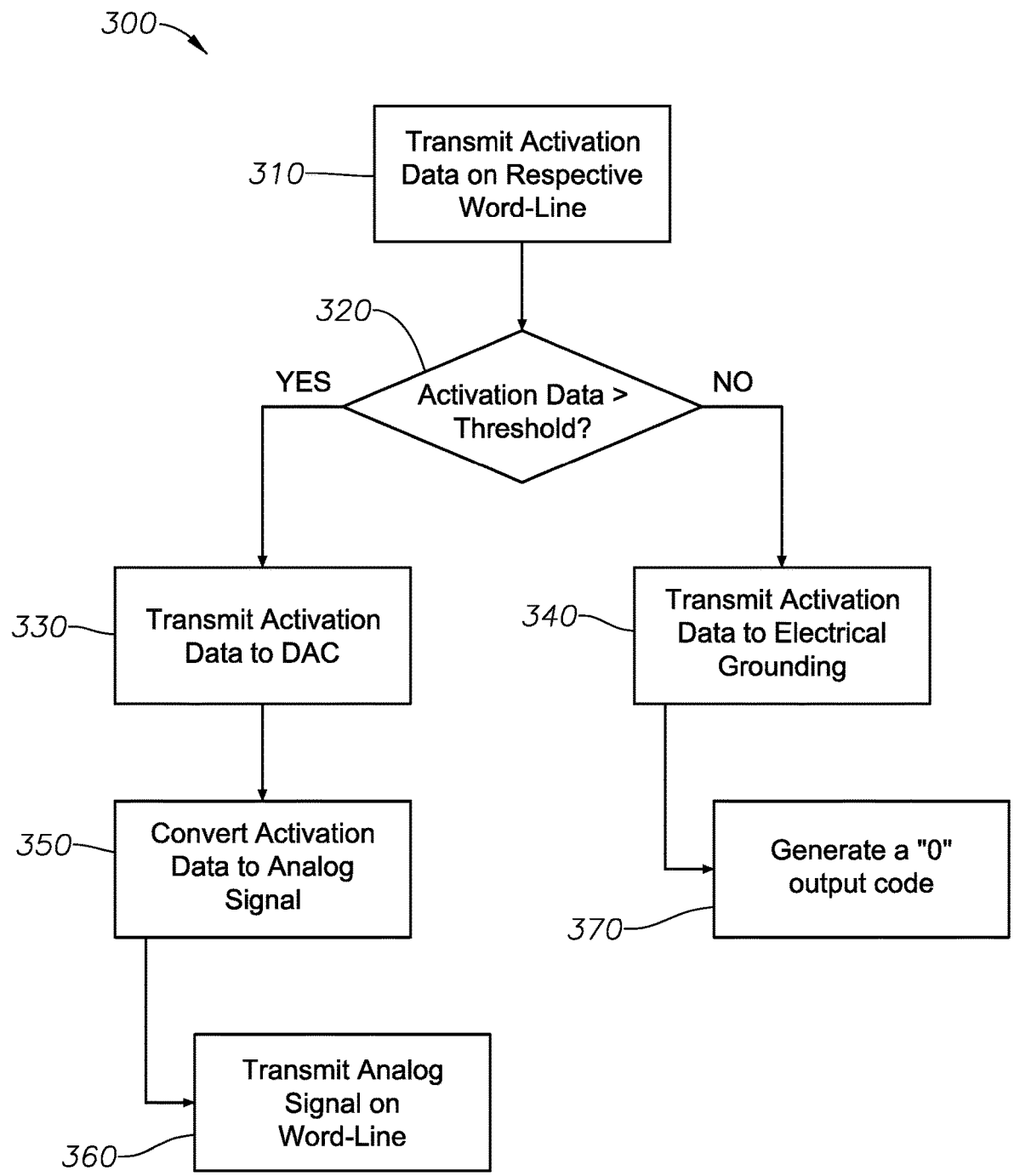
FIG. 3 is a flowchart of a particular illustrative aspect of methods of data conversion.

Referring to FIG. 3, an example circuit operation 300 applicable for the above-mentioned example optimized cross-bar memory array 100 in FIG. 1 (including the optimized DAC 120 in FIG. 2) is shown. The operation 300 may be performed with reference to circuit designs 100 and 120, as well as alternative circuit configurations as described herein.

For each cross-bar memory array 100 (e.g., a mixed-signal array), prior to the operation 400, digital words (i.e., M input N-bit digital words, incoming activation data (e.g., 8-bit signed data)), in certain implementations, may have undergone a prior ReLU operation such that the digital words are positive representations of the data.

With reference to FIGS. 1 and 2, at block 310, in each cycle, for each of the respective optimized DAC systems 120, activation data (i.e., digital words, digital data) are transmitted (i.e., input) on respective word-line channels 102. At block 320, a comparison is made by the digital comparator 122 whether the particular digital word is greater than or less than a threshold (i.e., a pruning threshold) (e.g., "0" or a value close to "0"). At block 330, if the digital word is greater than the threshold, the analog switch 124 is configured to allow for transmission of the digital word to the DAC device 126. In certain implementations, an enable signal 124 can be sent to the DAC device 126 to clock-gate the transmission; thus, allowing for a reduction in dynamic power dissipation. At block 340, if the digital word is less than the threshold, the analog switch is configured to allow for transmission of the digital word to electrical ground. At block 350, at the DAC device 126, the digital word is converted to an analog signal. Next, at block 360, the analog signal is transmitted on the word-line channel 102 coupled the plurality of the bit-cells 104 in accordance with the particular operation (e.g., neural network inference application). At block 370, from block 340, upon transmitting the digital word to electrical ground, a "0" output code is generated in accordance with the particular operation.

Figure 4:
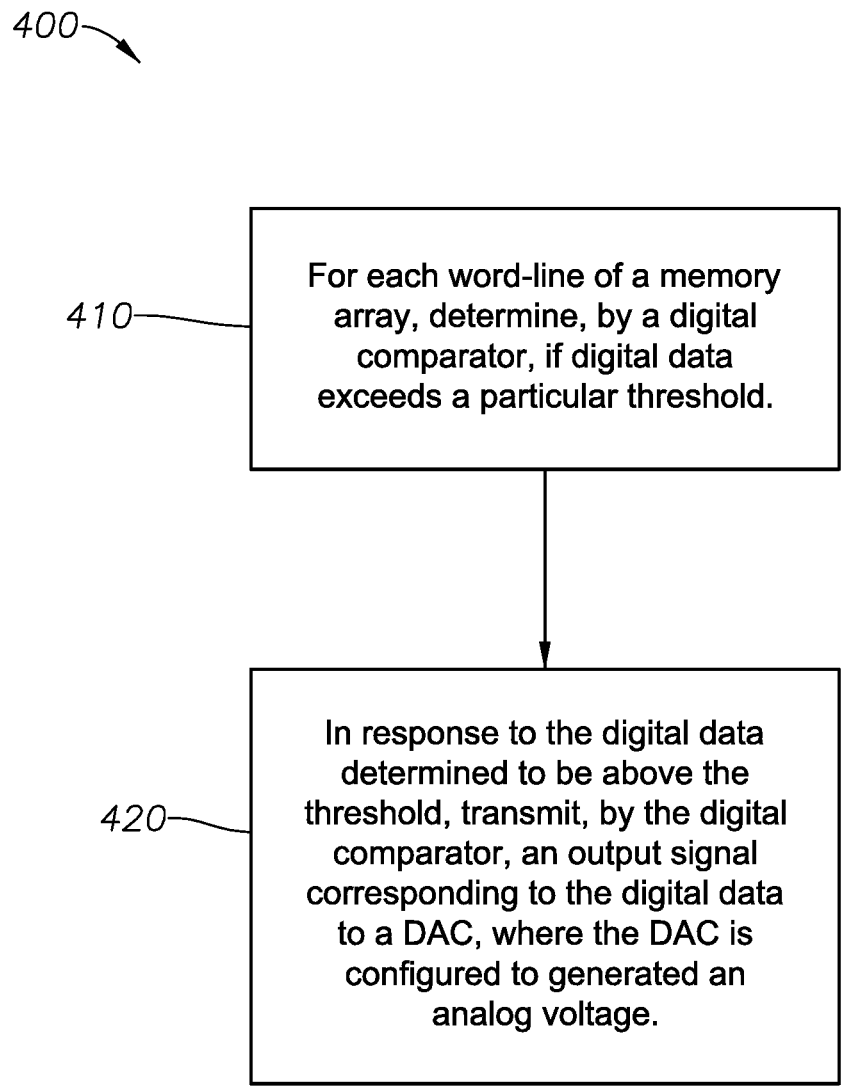
FIG. 4 is a flowchart of a particular illustrative aspect of methods of data conversion.

Referring to FIG. 4, a method flowchart 400 for the digital-to-analog data conversion in a memory array (including, for example, the operation as described with reference to FIG. 3) is shown. In certain examples, the method flow chart 400 is applicable to generate positive voltages for a word-line at an input to a mixed-signal array. While described with reference to the DAC system 120 in FIGS. 1 and 2, the method 400 may be performed in any circuit design in combination with FIGS. 1 and 2 or in an altogether different design.

At block 410, for each word-line of a memory array, a digital comparator is configured to determine whether incoming activation digital data exceeds a particular threshold. For example, as shown in FIG. 2, at a digital comparator 122, an input, activation 8-bit digital code (being one of M input 8-bit digital words) is compared to a pruning threshold (e.g., "0" or "near 0").

At block 420, in response to the digital data determined to be above the threshold, the digital comparator is configured to transmit an output signal (corresponding to the digital data) to a DAC device. Also, the DAC device is configured to generate an analog signal. For example, as shown in FIG. 2, the digital comparator 122 transmits an output signal to the DAC device 126 to generate an analog signal.

Figure 5:
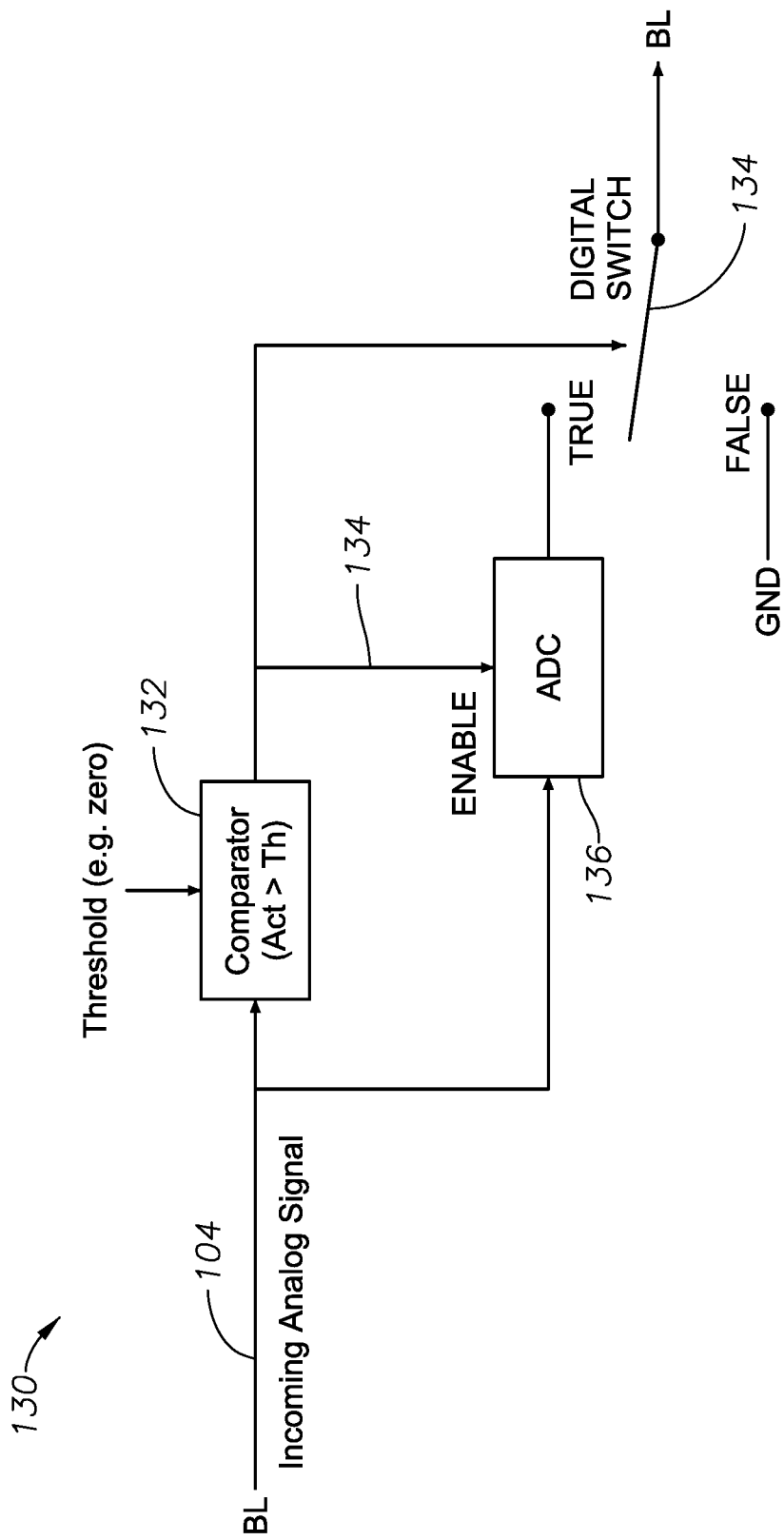
FIG. 5 is a schematic diagram of a portion of a memory array in FIG. 1 implementable with example methods for data conversion.

Referring to FIG. 5, an example optimized analog-to-digital (ADC) system 130 is shown. As depicted, the example ADC system 130 comprises an analog comparator 132, a digital switch 134, and an analog-to-digital (ADC) device 136. The analog comparator 132 may be one or more circuit device(s) (e.g., logic devices) that are configured to detect whether the incoming analog signal (voltage or current signal) is above (i.e., greater than) or below (i.e., less than) a particular threshold (i.e., a pruning threshold) (e.g., zero or a near-non-zero value, an arbitrary but pre-determined value, where the threshold value can define a set of "small" (positive low value) non-zero values). In some instances, such small non-zero values may also be ignored by the example ADC system 130.

The digital switch 134 may be implemented with any type of transistor-based switch (i.e., pull-down device, driver circuit) (e.g., NMOS devices (n-channel MOSFETs (metal-oxide-semiconductor field-effect transistors) devices), PMOS devices (PMOS devices (p-channel MOSFETs (metal-oxide-semiconductor field-effect transistors) devices), etc.).

The ADC device 136 may be any circuitry using various known electronic elements (e.g., including parallel comparator ADC, counter-type ADC, servo-tracking ADC, successive approximation register (SAR) ADC, ramp-compare ADC, Wilkinson ADC, integrating ADC, delta-encoded, pipelined, sigma-delta, etc.) to convert an analog input signal (i.e., an analog voltage or current signal) to a digital word (i.e., binary digital output signal). In certain implementations, the ADC device 136 can include the SAR ADC that is configured to perform serial binary search operations. In such implementations, a separate comparator (not shown) can be implemented to successively narrow a range that contains the input voltage. At each successive step, the converter compares the input voltage to the output of an internal ADC that can be configured to represent the midpoint of a selected voltage range. At each step in this process, the approximation is stored in the SAR. Moreover, in some implementations, the ADC device operation is configured to incorporate a rectifier linear unit (ReLU) operation.

In certain implementations of the optimized cross-bar memory array 100 in FIG. 1, one or more analog input signals (e.g., up to eight analog input signals from separate bit-lines 106) transmitted on respective one or more BLs 106 (e.g., multiple BL 106 of the respective ADC systems 130) can be coupled (i.e., inputted) to each ADC device 136 (i.e., a common ADC device) via an analog input multiplexer (not shown). In such implementations, for example, for the memory array 100, if the number of non-zero digital data is greater than the number of ADC devices, then at least two cycles will be needed to drive all of the BLs 106. Accordingly, in such implementations, the optimized cross-bar memory array 100 can realize additional savings by minimizing the quantity of required ADC devices 136, as well as an additional reduction in power consumption. In an example where the optimized cross-bar memory array 100 is a neural network, such implementations can be optimal to save overall circuit area, as a significant portion of incoming analog signals would correspond to "0" or near "0". Thus, such signals would not be transmitted through the ADC devices 136. Hence, such implementations would not require an individual respective ADC device 136 for each particular BL 106.

Figure 6:
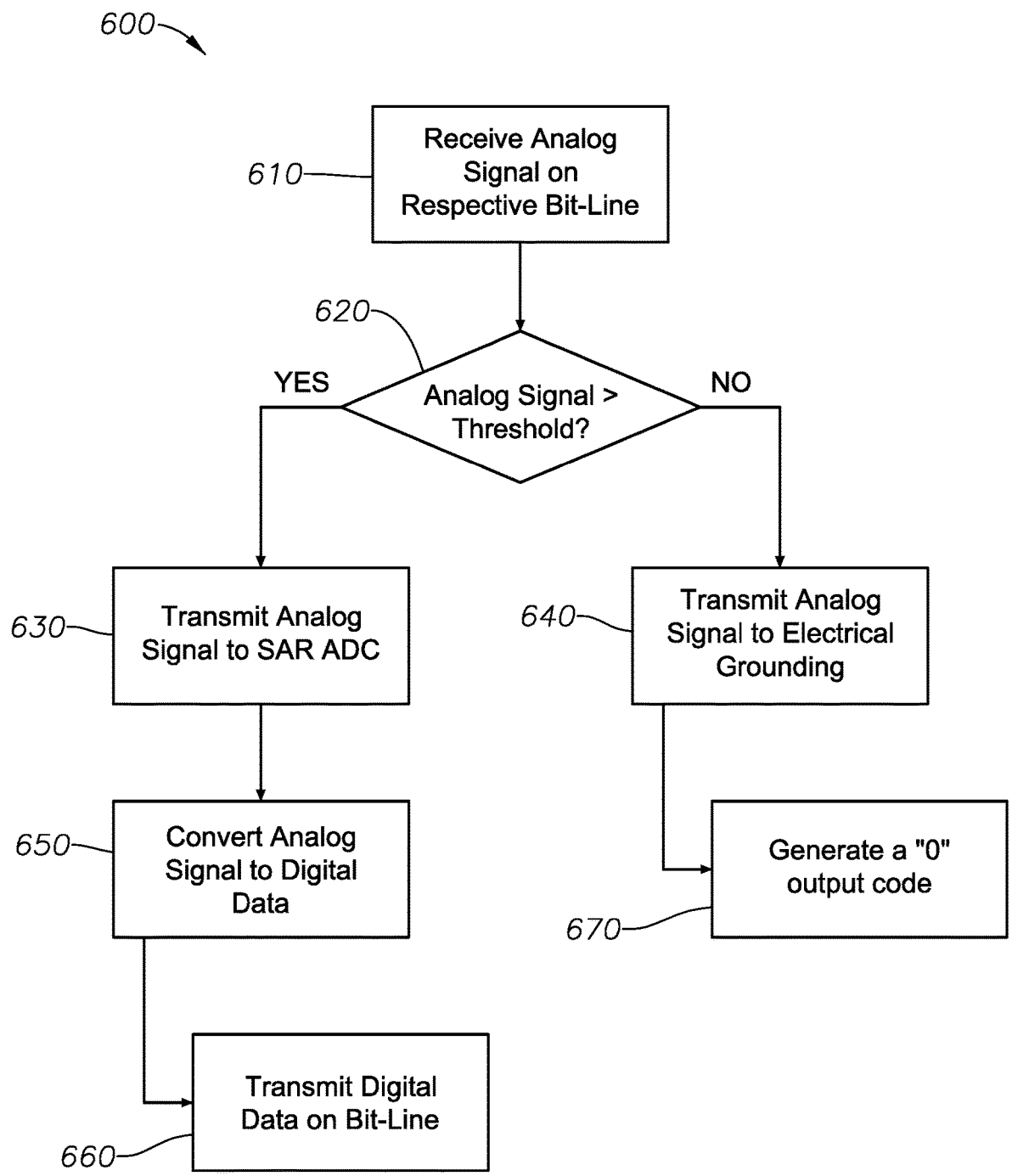
FIG. 6 is a flowchart of a particular illustrative aspect of methods of data conversion.

Referring to FIG. 6, an example circuit operation 600 applicable for the above-mentioned example optimized cross-bar memory array 100 in FIG. 1 (including the optimized ADC 130 in FIG. 5) is shown. The operation 600 may be performed with reference to circuit designs 100 and 130, as well as alternative circuit configurations as described herein.

For each cross-bar memory array 100 (e.g., a mixed-signal array), prior to the operation 600, respective analog signals are output from the plurality of bit-cells 104. With reference to FIGS. 1 and 6, at block 610, in each cycle, for each of the respective optimized ADC systems 130, analog signals (i.e., voltage or current signals) are transmitted (i.e., input) on respective bit-line channels 106. At block 620, a comparison is made by the analog comparator 132 whether the particular analog signal (i.e., bit-line value) is greater than or less than a threshold (i.e., a pruning threshold) (e.g., "0" or a value close to "0"). At step 630, if the bit-line value is greater than the threshold, the digital switch 134 is configured to allow for transmission of the bit-line value from the analog comparator 132 to the ADC device 136. In certain implementations, an enable signal 134 can be sent to the ADC device 136 to clock-gate the transmission; thus, allowing for a reduction in dynamic power dissipation. At block 640, if the bit-line value is less than the threshold, the digital switch is configured to allow for transmission from the analog comparator 132 to ground. At block 650, at the ADC device 136, the analog bit-line value is converted to digital data (i.e., a digital word). Next, at block 660, the digital word is transmitted on the bit-line channel 106 in accordance with the particular operation (e.g., neural network inference application). At block 670, from block 640, upon transmitting the digital word to electrical ground, a "0" output code is generated in accordance with the particular operation.

Advantageously, in accordance with the above-described operations, when the positive activations are also threshold pruned, the DAC and ADC systems 120, 130 can compare with the positive threshold value and stop to output zero when the input is lower than this particular reference. As the majority of activations would likely be less than the threshold, in most cases, the DAC and ADC systems 120, 130 can stop and generate a zero-output code after just one cycle. As a further benefit, due to the early out(s), digital-to-analog and analog-to-digital conversion would take a significantly shorter number of cycles on average, even though the total time required may be limited by any non-zero activations that are larger than the pruning threshold.

Figure 7:
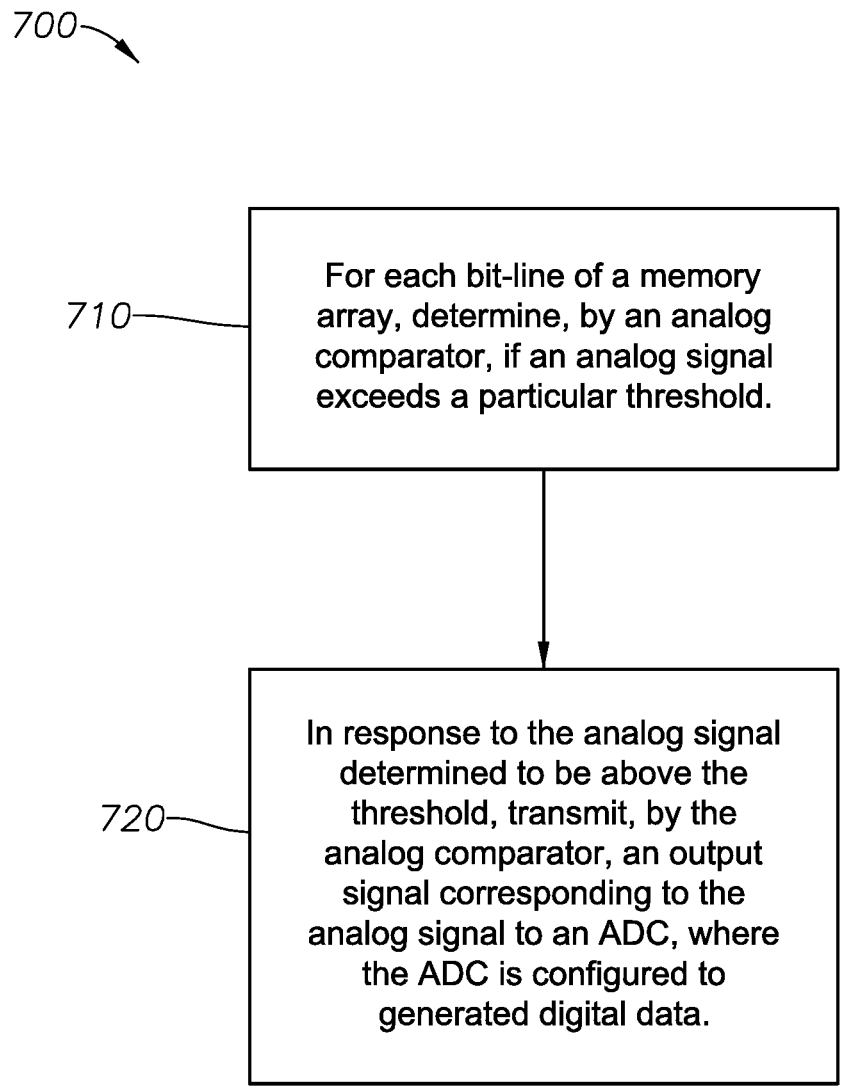
FIG. 7 is a flowchart of a particular illustrative aspect of methods of data conversion.

Referring to FIG. 7, a method flowchart 700 for analog-to-digital data conversion in a memory array (including, for example, the operation as described with reference to FIG. 6) is shown. In certain examples, the method flow chart 700 is applicable to generate positive digital output values for a bit-line at an output of a mixed-signal array. While described with reference to the ADC system 130 in FIGS. 1 and 5, the method 700 may be performed in any circuit design in combination with FIGS. 1 and 5 or in an altogether different design.

At block 710, for each bit-line of a memory array, an analog comparator is configured to determine whether incoming analog signal exceeds a particular threshold. For example, as shown in FIG. 5, at an analog comparator 132, an input, analog signal (being one of P input analog signals) is compared to a pruning threshold (e.g., "0" or "near "0").

At block 720, in response to the analog signal determined to be above the threshold, the analog comparator is configured to transmit an output signal (corresponding to the analog data) to an ADC device. Also, the ADC device is configured to generate digital data. For example, as shown in FIG. 2, the analog comparator 132 transmits an output signal to the ADC device 136 to generate digital data (i.e., a digital word).

Although one or more of FIGS. 1-7 may illustrate systems, apparatuses, or methods according to the teachings of the disclosure, the disclosure is not limited to these illustrated systems, apparatuses, or methods. One or more functions or components of any of FIGS. 1-7 as illustrated or described herein may be combined with one or more other portions of another of FIGS. 1-7. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A method comprising:
   for each word-line of a plurality of word-lines in a memory array:
      determining, by a digital comparator, if digital data exceeds a particular threshold; and
      in response to the digital data determined to be above the particular threshold, transmitting, by the digital comparator, an output signal corresponding to the digital data to a digital-to-analog converter (DAC), wherein the DAC is configured to generate an analog signal.

2. The method of claim 1, further comprising:
   for each of the word-lines in the memory array:
      transmitting the analog signal on the word-line in the memory array.

3. The method of claim 1, further comprising:
for each of the word-lines in the memory-array:
generating, by the digital comparator, an enable signal to clock-gate the output signal of the digital comparator.

4. The method of claim 1, further comprising:
for each of the word-lines in the memory array:
in response to the incoming digital data determined to be above the threshold, switching, by an analog switch, a coupling of the word-line from the digital comparator to electrical grounding to the digital comparator to the DAC.

5. The method of claim 1, further comprising:
for each of the word-lines in the memory array:
in response to the incoming digital data determined to be below the threshold, switching, by an analog switch, a coupling of the word-line from the digital comparator to the DAC to the digital comparator to electrical grounding.

6. The method of claim 5, further comprising:
for each of the word-lines in the memory array:
generating a "0" output code to be transmitted to the plurality bit-cells.

7. The method of claim 1, wherein the analog signal corresponds to an analog voltage or an analog current.

8. A method comprising:
for each of the bit-lines in a memory array:
determining, by an analog comparator, if an analog voltage exceeds a particular threshold; and
in response to the incoming data exceeding the particular threshold, transmitting, by the analog comparator, an output signal corresponding to the analog voltage to an analog-to-digital converter (ADC), wherein the ADC is configured to generate digital data.

9. The method of claim 8, further comprising:
for each of the bit-lines of the memory array:
transmitting the digital data on the bit-line in the memory array.

10. The method of claim 8, further comprising:
for each of the bit-lines of the memory-array:
generating, by the analog comparator, an enable signal to clock-gate the output signal of the analog comparator.

11. The method of claim 8, further comprising:
for each of the bit-lines of the memory array:
in response to the analog voltage determined to be above the threshold, switching, by a digital switch, the bit-line coupling from the digital comparator to electrical grounding to the digital comparator to the ADC.

12. The method of claim 8, further comprising:
for each of the bit-lines of the memory array:
in response to the analog voltage determined to be below the threshold, switching, by a digital switch, the bit-line coupling from the digital comparator to the ADC to the digital comparator to electrical grounding.

13. The method of claim 12, further comprising:
for each of the bit-lines of the memory array:
generating a "0" output code to be transmitted to the plurality bit-cells.

14. The method of claim 8, wherein the digital data corresponds to an 8-bit digital word.

15. A memory array comprising:
a plurality of word-lines coupled to a plurality of bit-cells, wherein each of the word-lines is configured to transmit data to the plurality of bit-cells;
a plurality of bit-lines coupled to the plurality of bit-cells, wherein each of the bit-lines is configured to transmit data from the plurality of bit-cells;
a plurality of digital-to-analog (DAC) systems configured to transmit data on the plurality of word-lines; and
a plurality of analog-to-digital (ADC) systems configured to receive data on the plurality of bit-lines;
wherein:
each of the plurality of DAC systems comprises:
a digital comparator;
an analog switch; and
a digital-to-analog (DAC) device; or
each of the plurality of ADC systems comprises:
an analog comparator;
a digital switch; and
an analog-to-digital (ADC) device; or
the memory array further comprises:
a set of digital multiplexers configured to couple one or more word-lines of the plurality of word-lines to one DAC, wherein the first set of digital multiplexers are configured to transmit data exceeding a pruning threshold; or
a set of analog multiplexers configured to couple one or more bit-lines of the plurality of bit-lines to one ADC, wherein the first set of analog multiplexers is configured to transmit data exceeding a pruning threshold.

16. The memory array of claim 15, wherein the memory array comprises a neural network mixed-signal array.

17. A memory array comprising:
a plurality of word-lines;
a digital-to-analog converter configured to generate an analog signal;
a digital comparator that:
determines, for each word-line of the plurality of word-lines in the memory array, whether digital data exceeds a particular threshold; and
transmits, in response to the digital data being determined to be above the particular threshold, an output signal corresponding to the digital data to the digital-to-analog converter.

* * * * *